US 10,883,948 B2

(12) United States Patent
Eastman et al.

(10) Patent No.: US 10,883,948 B2
(45) Date of Patent: Jan. 5, 2021

(54) MOISTURE MONITORING SYSTEM (71) Applicant: Franklin Fueling Systems, Inc., Madison, WI (US)

(72) Inventors: John Eastman, Scarborough, ME (US); Steven Carl Shaver, Biddeford, ME (US)

(73) Assignee: Franklin Fueling Systems, LLC, Madison, WI (US)

( * ) Notice: Subject to any disclaimer, the term of this patent is extended or adjusted under 35 U.S.C. 154(b) by 1754 days.

(21) Appl. No.: 13/771,789

(22) Filed: Feb. 20, 2013

(65) Prior Publication Data

US 2013/0215548 A1 Aug. 22, 2013

Related U.S. Application Data (60) Provisional application No. 61/600,997, filed on Feb. 20, 2012.

(51) Int. Cl.
*H01H 73/00* (2006.01)
*G01N 27/04* (2006.01)
*H01H 33/59* (2006.01)
*G01R 31/327* (2006.01)
*H01H 33/56* (2006.01)

(52) U.S. Cl.
CPC ......... *G01N 27/048* (2013.01); *G01R 31/327* (2013.01); *H01H 33/563* (2013.01); *H01H 33/59* (2013.01)

(58) Field of Classification Search
CPC ..... G01N 27/048; G01R 31/327; H01H 33/59
USPC .................................................. 361/42, 115
See application file for complete search history.

(56) References Cited

U.S. PATENT DOCUMENTS

| 3,831,430 A | 8/1974 | Azinger, Jr. |
| 3,887,915 A | 6/1975 | Olsen et al. |
| 4,057,699 A | 11/1977 | Reis |
| 4,829,149 A | 5/1989 | Jeanjean et al. |
| 4,977,513 A | 12/1990 | LaPalme |
| 5,128,269 A | 7/1992 | Oitate et al. |
| 5,388,451 A | 2/1995 | Stendin et al. |
| 5,421,190 A | 6/1995 | Brandle et al. |
| 5,502,435 A | 3/1996 | Ralston |
| 5,629,869 A | 5/1997 | Johnson et al. |
| 5,636,134 A | 6/1997 | Johnson et al. |
| 5,638,296 A | 6/1997 | Johnson et al. |
| 5,693,873 A | 12/1997 | Thuries et al. |

(Continued)

FOREIGN PATENT DOCUMENTS

EP 0637114 2/1995

OTHER PUBLICATIONS

WIKA, SF6 Gas Excellence, Aug. 2011.

(Continued)

*Primary Examiner* — Jared Fureman
*Assistant Examiner* — Lucy M Thomas
(74) *Attorney, Agent, or Firm* — Faegre Drinker Biddle & Reath LLP (57) ABSTRACT A monitoring system for an enclosure having an arc quenching gas includes at least one fluid characteristic sensor in fluid communication with an interior the enclosure, and an electronic controller operatively coupled to the at least one fluid characteristic sensor. The electronic controller forecasts a maintenance event based on values received from the at least one fluid characteristic sensor.

13 Claims, 7 Drawing Sheets

(56) References Cited

U.S. PATENT DOCUMENTS

| | | |
|---|---|---|
| 5,801,461 A | 9/1998 | Anger et al. |
| 5,946,171 A * | 8/1999 | Magnier .................. 361/37 |
| 6,023,404 A | 2/2000 | Marmonier |
| 6,043,464 A * | 3/2000 | Berger et al. ............. 219/494 |
| 6,125,692 A | 10/2000 | Marmonier |
| 6,205,846 B1 | 3/2001 | Dupraz et al. |
| 6,231,227 B1 | 5/2001 | Anderson |
| 6,236,548 B1 | 5/2001 | Marmonier |
| 6,263,914 B1 | 7/2001 | Meyer et al. |
| 6,324,891 B1 | 12/2001 | Gibeault et al. |
| 6,337,570 B1 | 1/2002 | Audren et al. |
| 6,361,205 B2 | 3/2002 | Anderson |
| 6,466,023 B2 | 10/2002 | Dougherty et al. |
| 6,522,247 B2 | 2/2003 | Maruyama et al. |
| 6,651,483 B1 | 11/2003 | Meyer et al. |
| 6,845,301 B2 | 1/2005 | Hamamatsu et al. |
| 6,921,428 B2 | 7/2005 | Yamamoto et al. |
| 7,145,322 B2 | 12/2006 | Solveson et al. |
| 7,184,895 B2 | 2/2007 | Chetay et al. |
| 7,253,602 B2 | 8/2007 | Shvach et al. |
| 7,257,496 B2 | 8/2007 | Rhodes et al. |
| 7,388,384 B2 | 6/2008 | Kato et al. |
| 7,417,554 B2 | 8/2008 | Benke et al. |
| 7,612,988 B2 | 11/2009 | Ulinskas |
| 7,675,738 B2 | 3/2010 | Fukunaga et al. |
| 7,684,881 B2 | 3/2010 | Lloyd |
| 7,755,362 B2 | 7/2010 | Stelter |
| 7,791,846 B2 | 9/2010 | Roscoe et al. |
| 7,816,924 B2 | 10/2010 | Kanazawa et al. |
| 7,937,985 B2 | 5/2011 | Chambon |
| 2001/0019573 A1 | 9/2001 | Dougherty et al. |
| 2005/0168891 A1 | 8/2005 | Nilman-Johnsson et al. |
| 2005/0225909 A1 * | 10/2005 | Yoshizaki ............ H01H 83/144 361/42 |
| 2007/0241079 A1 | 10/2007 | Johnson et al. |
| 2008/0192389 A1 | 8/2008 | Muench et al. |
| 2008/0314873 A1 | 12/2008 | Dahlquist et al. |
| 2009/0015991 A1 | 1/2009 | Hyrenbach et al. |
| 2010/0072174 A1 | 3/2010 | Asokan et al. |
| 2010/0102036 A1 | 4/2010 | Maruyama et al. |
| 2010/0141050 A1 | 6/2010 | Saito et al. |
| 2010/0326958 A1 | 12/2010 | Gregoire et al. |
| 2010/0326959 A1 | 12/2010 | Kanazawa et al. |
| 2011/0012615 A1 | 1/2011 | Hyde et al. |
| 2011/0073568 A1 | 3/2011 | Gibson et al. |
| 2011/0093216 A1 * | 4/2011 | Andersson ......... G01N 33/2847 702/24 |
| 2011/0127237 A1 | 6/2011 | Uchii et al. |
| 2012/0118043 A1 | 5/2012 | Heckler et al. |

OTHER PUBLICATIONS

Zarko Djekic, "Online Circuit Breaker Monitoring System", Thesis, Texas A & M University, Dec. 2007.

J.P. Dupraz et al., "Remote Supervision for Intelligent Circuit Breakers and Gas Insulated Substations", Jul. 2008, IEEE.

InuoSys, "On-Line Circuit Breaker Condition Monitor BMS 1000", at least as early as Jul. 29, 2011.

Mladen Kezunovic et al., Power Systems Engineering Research Center, "Automated Circuit Breaker Monitoring", Nov. 2007.

Anton Pöltl et al., "Field Experiences with HV Circuit Breaker Condition Monitoring", ABB, Jun. 2011.

C. Sweetser et al., "Strategies for Selecting Monitoring of Circuit Breakers", IEEE Transactions on Power Delivery, vol. 17, No. 3, Jul. 2002.

Incon, "Circuit Breaker Wear and Condition Monitor", at least as early as Feb. 2012.

ABB, "Circuit Breaker Sentinel (CBS) for SF6 Power Circuit Breakers", Nov. 2011.

Siemens, "Substation Monitoring System SF6 Gas Density Monitoring", at least as early as Feb. 2012.

Granzow, Inc., "Model 8774 Trafag SF6 Gas Density Controls", 2013.

WIKA, "Gas Management for the Smart Grid", IEEE, Chicago, Apr. 2008.

Siemens, "SPS2 Circuit Breaker", 2006.

WIKA, "SF6 Emission Monitoring: State-of-the-Art SF6 Tracking", EPA Workshop 2009.

Response filed in European Patent Application 13707515.6, dated Apr. 14, 2015.

International Search Report in PCT Application No. PCT/US2013/026846, dated May 8, 2013, 5 pages.

Canadian Office Action dated Jan. 2, 2019 in corresponding application No. CA 2,865,094.

* cited by examiner

MOISTURE MONITORING SYSTEM

The present application claims the benefit of U.S. Provisional Patent Application Ser. No. 61/600,997, filed Feb. 20, 2012, entitled MOISTURE MONITORING SYSTEM, the entire disclosure of which is expressly incorporated by reference herein.

RELATED APPLICATIONS

This application is related to U.S. Provisional Patent Application Ser. No. 61/448,585, filed Mar. 2, 2011, entitled GAS DENSITY MONITORING SYSTEM, docket FEC0160, and U.S. patent application Ser. No. 13/411,011, published as U.S. Patent Application Publication No. 2012-0306656, and filed Mar. 2, 2012, entitled GAS DENSITY MONITORING SYSTEM, the entire disclosures of which are expressly incorporated by reference herein.

BACKGROUND

Circuit breakers and other electrical equipment may be provided in an enclosure having a $SF_6$ containing gas contained therein. The $SF_6$ gas is an arc quenching gas that functions to reduce arc intensity or arc occurrence when a circuit breaker is moved to an open state. Too much moisture in the $SF_6$ gas may cause problems. For example, the moisture mixes with arc by-products to form acids that corrode the internals of the circuit breaker. Circuit breakers are often equipped with desiccant bags to reduce the moisture content in the $SF_6$ gas. However the desiccant bags have a limited capacity and may saturate.

SUMMARY

The present invention relates generally to systems and methods related to monitoring circuit breakers and in particular to monitoring moisture characteristics associated with the circuit breakers.

In one embodiment, a monitoring system for an enclosure including an arc quenching gas is provided. The monitoring system comprises a moisture sensor in fluid communication with an interior of the enclosure, and an electronic controller operatively coupled to the moisture sensor. The electronic controller is configured to forecast a maintenance event based on values received from the moisture sensor.

In another embodiment of the present disclosure, a monitoring system for an enclosure including an arc quenching gas is provided. The monitoring system comprises a moisture sensor in fluid communication with an interior the enclosure, a fill port for communicating arc quenching gas to an interior of the enclosure, and an electronic controller operatively coupled to the moisture sensor. The electronic controller determines an occurrence of a fill event and determines a moisture characteristic of a fill gas of the fill event.

In a further embodiment of the present disclosure, a circuit breaker system is provided. The circuit breaker system comprises an enclosure having at least a first conductive element and a second conductive element and an arc quenching gas within an interior of the enclosure and generally surrounding the first and second conductive elements. The circuit breaker system also comprises a monitoring system having a housing configured to receive a fill gas and further configured to flow the fill gas to the enclosure. Additionally, the monitoring system includes at least one fluid characteristic sensor supported by the housing, and an electronic controller configured to receive a signal from the at least one fluid characteristic sensor to determine at least one moisture characteristic of the arc quenching gas.

In one embodiment of the present disclosure, a method of monitoring a circuit breaker is provided. The circuit breaker has a first conductive element and a second conductive element moveable relative to the first conductive element. The first conductive element and the second conductive element cooperate to provide a closed state that permits an electrical current to flow between the first conductive element and the second conductive element and an open state wherein the first conductive element is spaced apart from the second conductive element. The first conductive element and the second conductive element are positioned in an interior of an enclosure including an arc quenching gas. The method comprises the steps of positioning at least one fluid characteristic sensor in fluid communication with the interior of the enclosure, monitoring a relative humidity of the interior of the enclosure with the at least one fluid characteristic sensor, forecasting a maintenance event of the circuit breaker based on the relative humidity.

In a further embodiment of the present disclosure, a method of monitoring conditions within an interior of an enclosure of a circuit breaker is provided. The enclosure includes a first conductive element and a second conductive element moveable relative to the first conductive element. The method comprises the steps of introducing a fluid containing an arc-quenching gas into the interior of the enclosure and monitoring relative humidity of the fluid within the interior of the enclosure. The method further comprises the steps of comparing the relative humidity of the fluid to a predetermined threshold value and maintaining a flow of the fluid into the interior of the enclosure when the relative humidity of the fluid is less than the predetermined threshold value.

BRIEF DESCRIPTION OF THE DRAWINGS

The foregoing aspects and many of the attendant advantages of this invention will become more readily appreciated as the same become better understood by reference to the following detailed description when taken in conjunction with the accompanying drawings.

Corresponding reference characters indicate corresponding parts throughout the several views. Although the drawings represent embodiments of various features and components according to the present disclosure, the drawings are not necessarily to scale and certain features may be exaggerated in order to better illustrate and explain the present disclosure. The exemplification set out herein illustrates embodiments of the invention, and such exemplifications are not to be construed as limiting the scope of the invention in any manner.

DETAILED DESCRIPTION OF THE DRAWINGS

For the purposes of promoting an understanding of the principles of the invention, reference will now be made to the embodiments illustrated in the drawings, which are described below. The embodiments disclosed below are not intended to be exhaustive or limit the invention to the precise form disclosed in the following detailed description. Rather, the embodiments are chosen and described so that others skilled in the art may utilize their teachings. It will be understood that no limitation of the scope of the invention is thereby intended. The invention includes any alterations and further modifications in the illustrated devices and described methods and further applications of the principles of the invention which would normally occur to one skilled in the art to which the invention relates.

Figure 1:
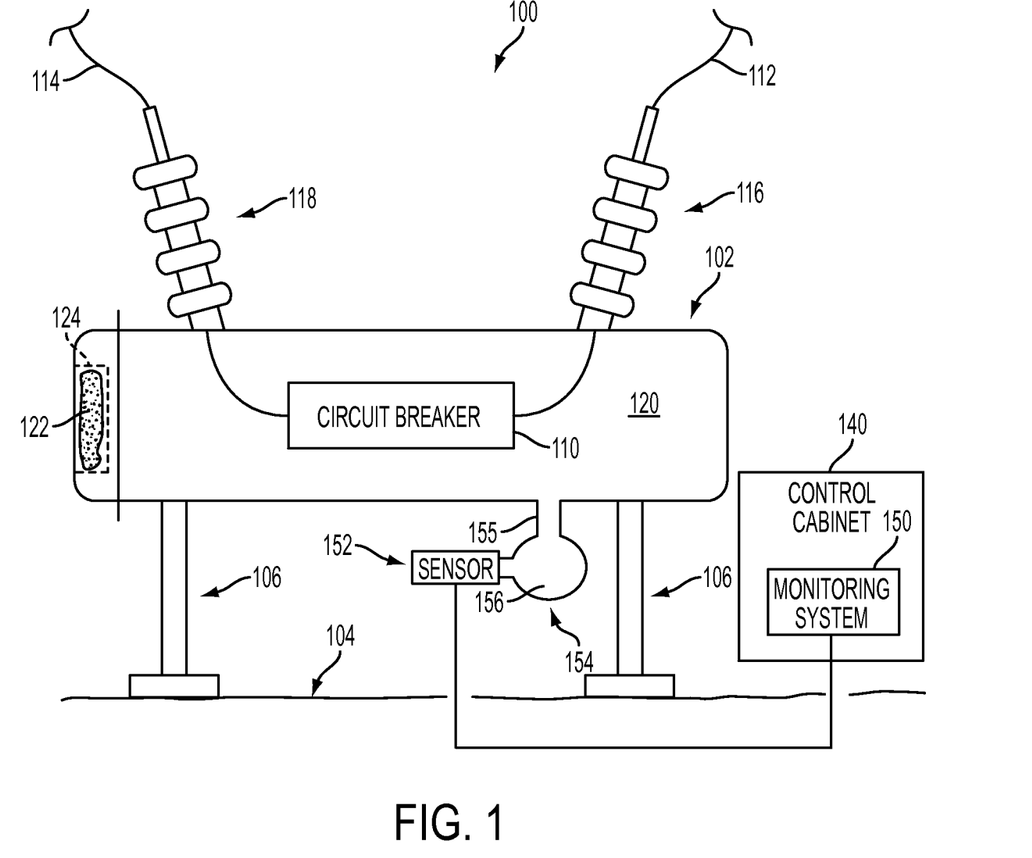
FIG. 1 illustrates a representative view of an exemplary circuit breaker system including an enclosure.

Referring to FIG. 1, an exemplary high voltage circuit breaker system 100 is shown. Circuit breaker system 100 includes an enclosure 102 which houses a circuit breaker 110. Enclosure 102 is supported off of the ground 104 by a frame 106. Circuit breaker 110 is connected to power line 112 and power line 114 through high voltage bushings 116 and 118, respectively.

Exemplary circuit breakers 110 are disclosed in U.S. Provisional Patent Application Ser. No. 61/448,585, and U.S. patent application Ser. No. 13/411,011, the disclosures of which are expressly incorporated by reference herein. As explained in U.S. Provisional Patent Application Ser. No. 61/448,585, and U.S. patent application Ser. No. 13/411,011, an exemplary circuit breaker 110 includes a first conductive element and a second conductive element which is moveable relative to first conductive element. When the first conductive element and the second conductive element are in a closed state, i.e., when the first conductive element is in physical contact with the second conductive element, electricity is able to flow between first power line 112 and second power line 114. By contrast, when the first and second conductive elements are in an open state, i.e., when the first conductive element is separated from the second conductive element, electricity generally is unable to flow between the first power line 112 and the second power line 114.

Returning to FIG. 1, enclosure 102 provides a sealed interior 120 which houses circuit breaker 110. Interior 120 may be filled with various gases having characteristics to suppress arc events when circuit breaker 110 is opened. An exemplary gas is Sulfur-Hexa-Fluoride ("$SF_6$") or a mixture including $SF_6$. Other exemplary gases may be used. The presence of the gas as a dielectric reduces the amount of damage experienced by circuit breaker 110 due to an arc because the gas acts to extinguish the arc. An exemplary circuit breaker 110 and enclosure 102 are the Siemens SPS2 circuit breaker (15 kV-245 kV) available from Siemens Power Transmission and Distribution located at 444 Hwy. 49 S in Richland, Miss. 39218 USA.

Enclosure 102 provides a generally sealed volume around the circuit breaker 110. The gas in enclosure 102 may over time leak from the interior 120 of enclosure 102 to the exterior of enclosure 102. Further, outside air may enter the enclosure 102 bringing with it moisture. This increased moisture may result in degradation of the components of the circuit breaker 110. Enclosure 102 includes within its interior 120, drying members 122 which operate to remove moisture from the gas within interior 120 of enclosure 102. Exemplary drying members 122 include desiccant bags which are held in a holder 124 and are in contact with the gas within interior 120 of enclosure 102. The desiccant bags remove moisture from the gas. Over time the desiccant bags become saturated with moisture. When this happens the moisture content within interior 120 of enclosure 102 increases.

Figure 2:
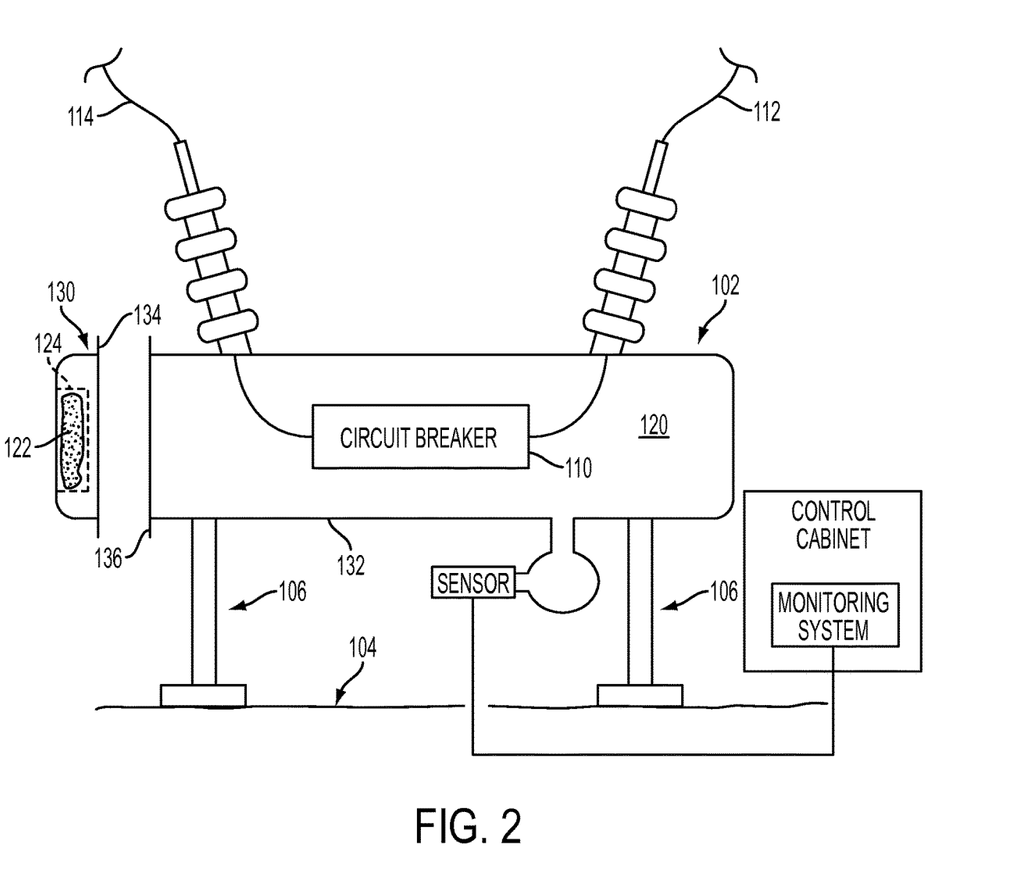
FIG. 2 illustrates the circuit breaker system of FIG. 1 wherein access is provided to an interior of the enclosure of the circuit breaker system.

Utilities periodically replace the desiccant bags in an attempt to prevent saturation of the desiccant bags. Referring to FIG. 2, the desiccant bags are provided in an end cap 130 of enclosure 102 which is removable from a main body 132 of enclosure 102. End cap 130 and main body 132 include mating flanges 134 and 136 which may be used to couple end cap 130 to main body 132. To replace the desiccant bags, end cap 130 is removed, the old desiccant bags are removed, new desiccant bags are installed, and end cap 130 is reattached to main body 132.

Returning to FIG. 1, a control cabinet 140 is shown. Control cabinet 140 may be supported by enclosure 102 or may be free-standing. A monitoring system 150 is provided which monitors the operation the circuit breaker 110 and the environment of circuit breaker 110. Exemplary monitoring systems 150 are disclosed in U.S. Provisional Patent Application Ser. No. 61/448,585, and U.S. patent application Ser. No. 13/411,011, the disclosures of which are expressly incorporated by reference herein. As mentioned in U.S. Provisional Patent Application Ser. No. 61/448,585, and U.S. patent application Ser. No. 13/411,011, the monitoring systems may monitor one or more characteristics of the gas surrounding the circuit breaker and one or more electrical characteristics of the circuit breaker. These monitored characteristics are used to determine if the circuit breaker requires maintenance and/or to forecast maintenance events. In U.S. Provisional Patent Application Ser. No. 61/448,585, and U.S. patent application Ser. No. 13/411,011, an exemplary gas characteristic is gas density. For example, fault arc energy of circuit breaker system 100 may be correlated to gas density values. The fault arc energy values and the corresponding gas density values may be referenced in a look-up table, such as the table in FIG. 21 of U.S. Provisional Patent Application Ser. No. 61/448,585, and U.S. patent application Ser. No. 13/411,011, the disclosures of which are expressly incorporated by reference herein. Monitoring system 150 of the present application may determine and use the fault arc energy values and/or the gas density values for maintenance event forecasting of circuit breaker system 100 in combination with humidity values.

In the present application, one exemplary gas characteristic monitored by monitoring system 150 is relative humidity or another moisture characteristic indicative of the amount of moisture in the gas within interior 120 of enclosure 102. In one embodiment, exemplary monitoring system 150 is configured to monitor the gas density and/or fault arc energy characteristics as well as the relative humidity of the gas within enclosure 102.

Referring to FIG. 1, at least one fluid characteristic sensor, for example at least a moisture sensor 152, density sensor 153, and/or a temperature sensor, is coupled to a housing 154. Housing 154 is in turn coupled to enclosure 102. An interior 156 of housing 154 is in fluid communication with interior 120 of enclosure 102. In the exemplary embodiment, sensor 152 contacts the fluid within interior 156 of housing 154. In one embodiment, sensor 152 is a moisture sensor and monitors one or more characteristics of the gas within interior 156, and hence the gas within enclosure 102. Sensor 152 may be positioned within enclosure 102 or at any other location in a piping network for circuit breaker system 100 that is in fluid communication with the gas within interior 120 of enclosure 102. Gas containing moisture drifts around interior 120 and interior 156 and is detected by sensor 152 in interior 156 of housing 154.

An exemplary moisture sensor 152 is a relative humidity sensor which provides an indication of the relative humidity of the gas within interior 120 of enclosure 102. One exemplary sensor is a polymer capacitive humidity sensor, for example Model No. AM2303 Digital-output relative humidity and temperature sensor module available from Aosong (Guangzhou) Electronics Co., Ltd, located at No 56, Renhe Road, Renhe Town, Baiyun District, Guangzhou, China. Additional details related to the AM2303 sensor are provided in Appendix A of U.S. Provisional Patent Application Ser. No. 61/600,997, the disclosure of which is incorporated by reference herein. When the AM2303 sensor is pulsed, it provides relative humidity and temperature data in a stream. This data stream may be provided back over the power connection to the AM2303 sensor. This data stream may be converted by supporting electronics to provide a signal that reports both relative humidity and temperature. The frequency of the converted signal represents the relative humidity and the pulse width represents the temperature. This output has the same form as the gas density sensors disclosed in U.S. Provisional Patent Application Ser. No. 61/448,585, and U.S. patent application Ser. No. 13/411,011. As such, the converted signal from the AM2303 sensor may be connected to the monitoring system disclosed in U.S. Provisional Patent Application Ser. No. 61/448,585, and U.S. patent application Ser. No. 13/411,011. Alternatively, other embodiments may measure relative humidity using chilled mirror technology.

Figure 8:
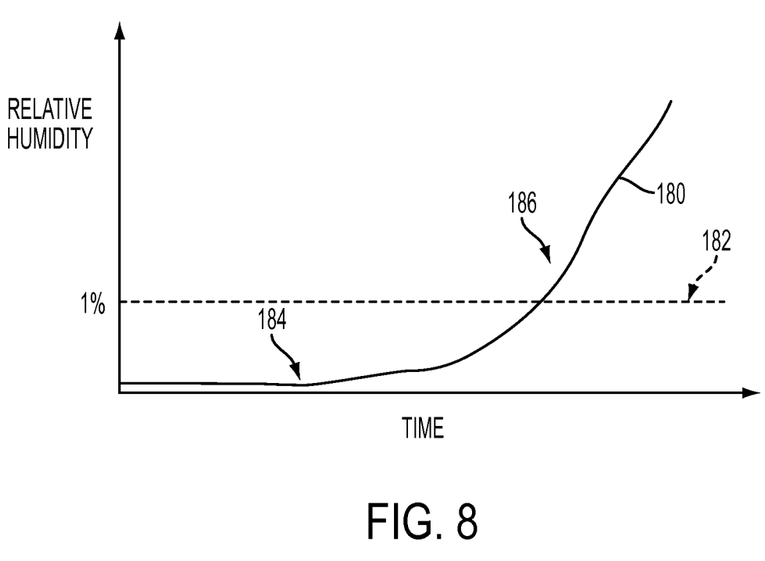
FIG. 8 illustrates a representative view of the moisture in the enclosure of FIG. 1 over time.

The monitoring system 150, which may include the functionality of the monitoring systems disclosed in U.S. Provisional Patent Application Ser. No. 61/448,585, and U.S. patent application Ser. No. 13/411,011, may track the relative humidity level of the gas within interior 120 of enclosure 102. Referring to FIG. 8, a curve 180 is shown. Curve 180 indicates the relative humidity of the gas within interior 120 of enclosure 102. A threshold line 182 is also shown. Illustratively, the threshold line is at 1%. Other thresholds are contemplated. Exemplary thresholds include 0.5% and 2%.

During the first part 184 of curve 180, the relative humidity values of the gas within interior 120 of enclosure 102 are far below threshold line 182. During these portions of the curve 180, the desiccant bags within enclosure 102 are removing the moisture from the gas within interior 120 of enclosure 102. In the second part 186 of the curve, the desiccant bags have become saturated and the relative humidity within interior 120 has started to rise and passes the threshold line 182.

In one embodiment, a controller 190 of monitoring system 150 executes humidity maintenance event forecasting software 192 to monitor the relative humidity. The logic of the humidity maintenance event forecasting software 192 based on a received relative humidity value from sensor 152 compares the relative humidity value to threshold line 182 stored in a memory 196. If the relative humidity value is below the threshold value then monitoring system 150 waits for the next relative humidity value. If the relative humidity value is above the threshold value then monitoring system 150 indicates an alarm. The alarm may be indicated in one of the alarm outputs disclosed in U.S. Provisional Patent Application Ser. No. 61/448,585, and U.S. patent application Ser. No. 13/411,011. Exemplary alarm outputs include a light on monitoring system 150 or a message or other indication sent to a remote computing device 200 (see FIG. 7). Exemplary remote computing devices include a computing device at a monitoring center, a portable computing device carried by a service technician, or other computing devices not located at the circuit breaker installation. In the illustrated embodiment, remote computing device 200 is accessed through a network 202. Exemplary networks include wired and wireless networks.

In one embodiment, the indication of an alarm may cause a controller which controls the state of the circuit breaker to prevent opening of the circuit breaker.

As discussed above, monitoring system 150 monitors when the measured relative humidity exceeds the threshold line 182. In one embodiment, monitoring system 150 provides different threshold levels based on the measured temperature. In one embodiment, the threshold levels may be set by an operator.

In one embodiment, monitoring system 150 further maintains the measured relative humidity values as historical humidity values 194 in memory 196. Monitoring system 150 may determine a slope of at least a portion of the stored historical humidity values 194 to forecast when curve 180 will cross threshold line 182. In this manner, monitoring system 150 may predict an upcoming maintenance event and the expected time of occurrence. Other trending may be implemented based on the received humidity values.

In one embodiment, the received humidity values and the received temperature values are used to forecast maintenance events or to determine alarm levels. Although relative humidity is one example of a moisture characteristic of the gas in interior 120 of enclosure 102, other moisture characteristics may be evaluated. Exemplary moisture characteristics include dew point, frost point, parts per million by volume, and relative humidity.

Figure 3:
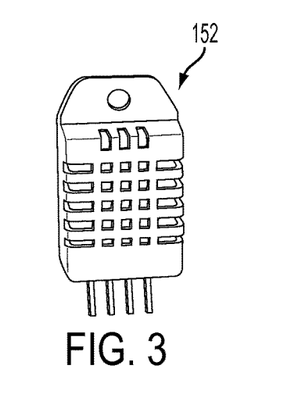
FIG. 3 illustrates a representative moisture sensor.
Figure 4:
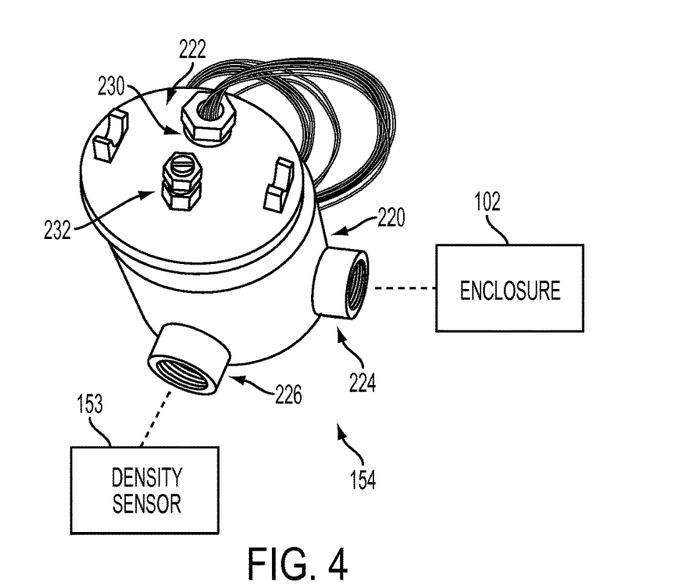
FIG. 4 illustrates an exemplary housing for the moisture sensor of FIG. 3.

Referring to FIG. 3, an exemplary humidity sensor 152 is shown. Referring to FIG. 4, an exemplary housing 154 is shown. Housing 154 includes a base 220 and a lid 222. Base 220 includes a first port 224 which may be coupled to a pipe 155 which in turn is coupled to enclosure 102. Interior 156 of housing 154 is in fluid communication with interior 120 of enclosure 102 through lid 222. In one embodiment, housing 154 is a DC-400 cast aluminum enclosure.

Base 220 includes a second port 226 to which a sensor may be coupled. In one embodiment, the sensor is a gas density sensor 153. Exemplary gas density sensors are disclosed in U.S. Provisional Patent Application Ser. No. 61/448,585, and U.S. patent application Ser. No. 13/411,011. Although base 220 is shown with a single sensor port 226, in one embodiment, base 220 includes multiple sensor ports to provide a sensor manifold for connecting sensors to the gas within interior 120 of enclosure 102. In one embodiment, a motorized agitator is provided in the bottom of base 220 to assist in circulating the air within interior 156.

Figure 5:
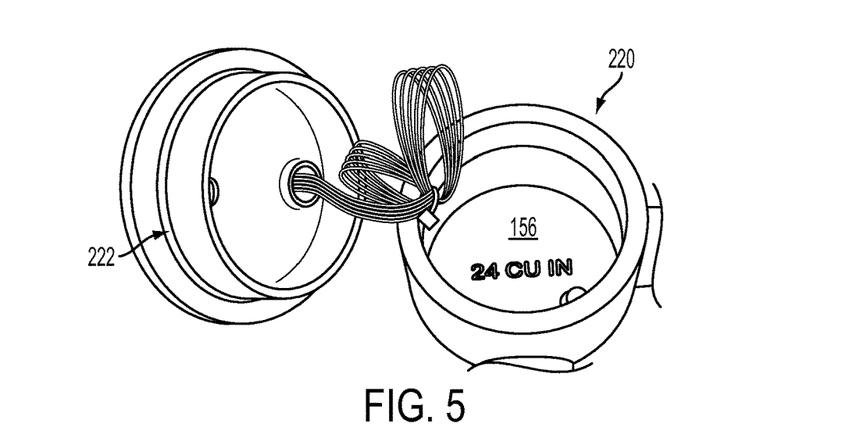
FIG. 5 illustrates the exemplary housing of FIG. 4 with a top of the housing removed.

Sensor 152 is placed in interior 156. The connecting wires for sensor 152 extend through a port 230 in lid 222. In one embodiment, sensor 152 and the supporting electronics to convert the sensor output are potted to the inside of lid 222. Therefore, sensor 152 may be replaced by replacing lid 222. Lid 222 further includes a bleed valve 232.

Figure 6:
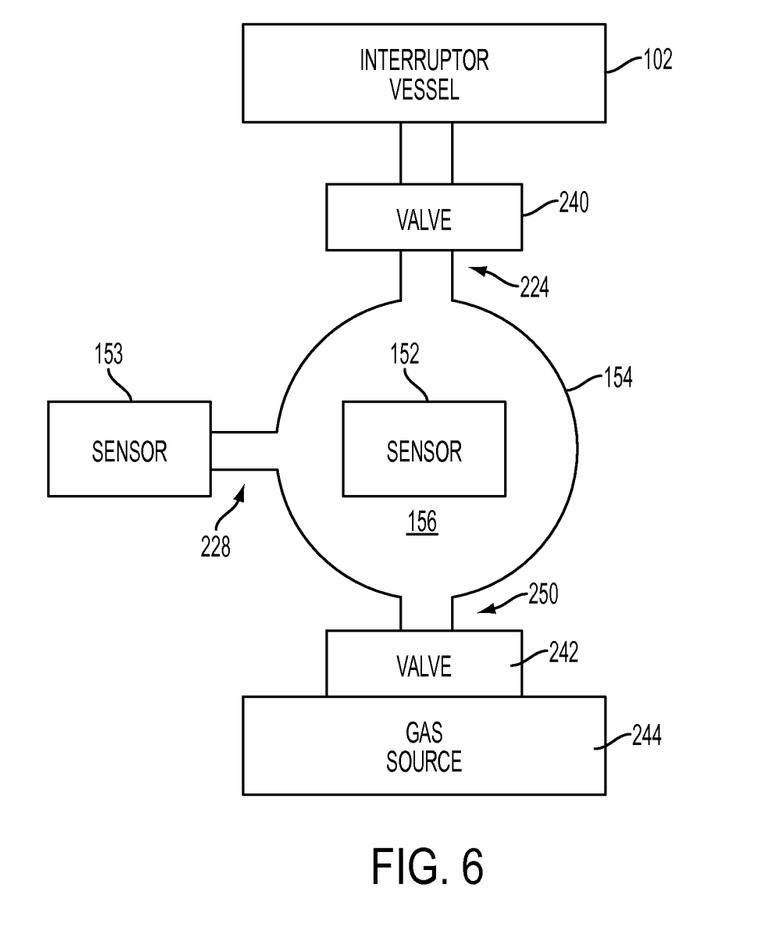
FIG. 6 illustrates a representative view of an exemplary fill system for the circuit breaker system of FIG. 1.

Referring to FIG. 6, in one embodiment, housing 154 includes a third port 250 having a fill valve 252 coupled thereto. A gas source 244 may be coupled to fill valve 252 to provide gas to the interior 120 of enclosure 102 through housing 154 during a fill operation. Further, in one embodiment, a second valve 240 is provided between first port 224 of housing 154 and enclosure 102. Second valve 240 permits an operator to valve off housing 154 such that interior 156 is not in fluid communication with interior 120. One reason may be to prevent gas flow from interior 120 while sensor 152 is replaced. Once sensor 152 is replaced, valve 240 may be opened and the bleed valve 232 may be actuated to permit the flow of gas from interior 120 of enclosure 102 into interior 156 of housing 154.

During a fill operation wherein gas is provided from gas source 244, second valve 240 is in an open configuration to permit gas flow from interior 156 into interior 120 of enclosure 102. By having the gas flow past sensor 152 during a fill operation, monitoring system 150 may monitor the moisture content of the fill gas. In one embodiment, monitoring system 150 detects when a fill operation is occurring. In one example, monitoring system 150 monitors the density of the gas in interior 120 of enclosure 102 and when the density level rises above a threshold amount, monitoring system 150 assumes a filling operation is occurring. Additional details regarding the detection of a filling operation are provided in U.S. Provisional Patent Application Ser. No. 61/448,585, and U.S. patent application Ser. No. 13/411,011.

Figure 7:
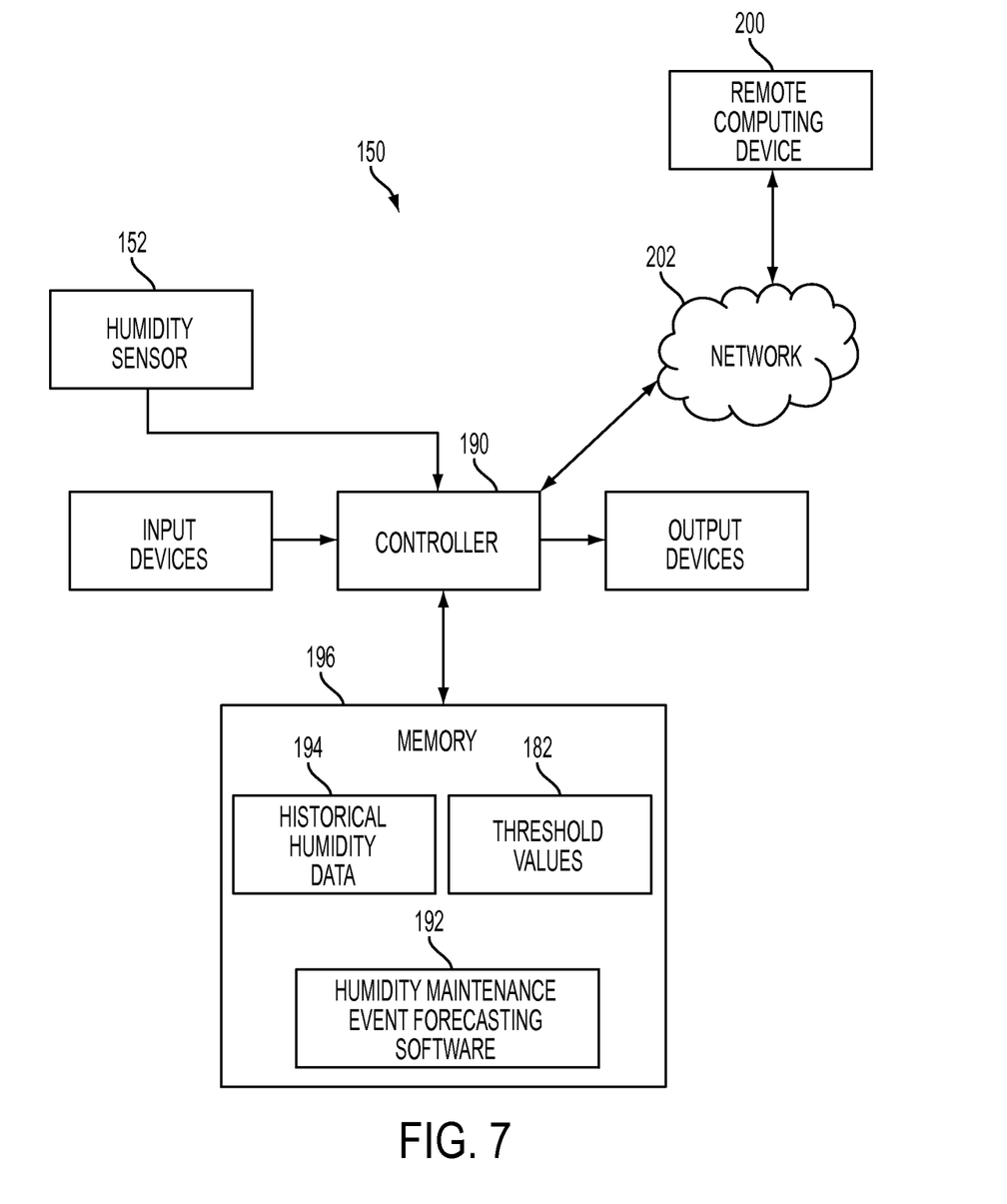
FIG. 7 illustrates an exemplary monitoring system for the circuit breaker system of FIG. 1.

When a fill operation is occurring, monitoring system 150 monitors the relative humidity of the fill gas. If the fill gas relative humidity is above a threshold level, monitoring system 150 may initiate an alarm. The alarm may be sent to remote computing device 200 or displayed locally. In one embodiment, based on the moisture level in the fill gas, a consideration owed to or required from the vendor supplying the gas may be altered. Exemplary alterations of consideration include the gas vendor may be docked a portion of the invoice amount or charged for contributing to the premature need to replace the drying members 122 of enclosure 102. In one embodiment, monitoring system 150 may close second valve 240 to end the fill event if the moisture level in the fill gas is above a threshold amount. In one embodiment, monitoring system 150 may provide a rating for the gas vendor which can be used in the future in the selection of gas vendors.

Figure 9:
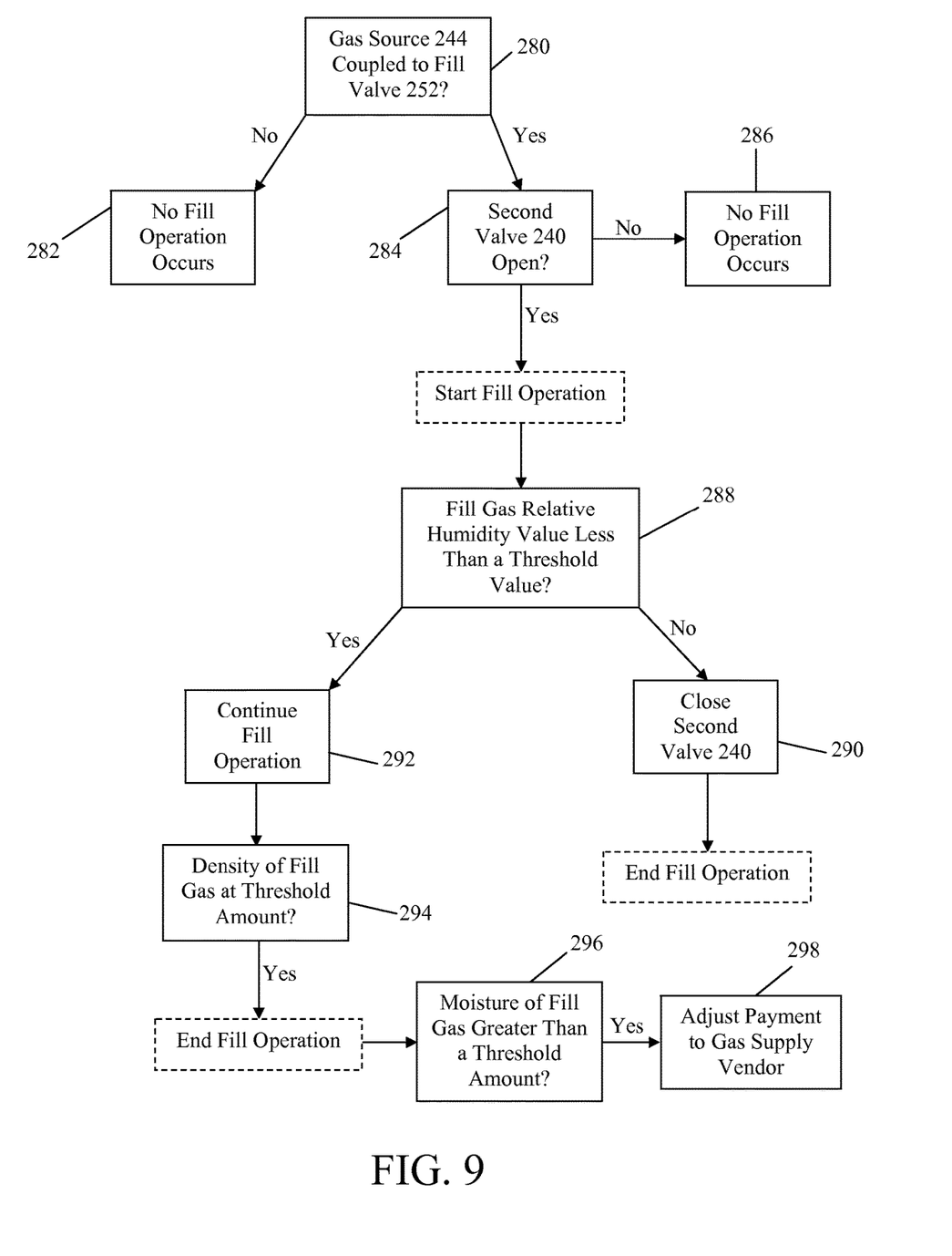
FIG. 9 illustrates a flow chart of a fill operation of the exemplary fill system of FIG. 6.

Referring to FIG. 9, an exemplary fill operation is shown. As shown at 280, a fill operation may be initiated when gas source 244 is coupled to fill valve 252. If gas source 244 is not coupled to fill valve 252, then the fill operation does not occur, as shown at 282. However, if gas source 244 is coupled to fill valve 252, then it is determined if second valve 240 is open, as shown in box 284. If second valve 240 is not open, then, as shown at box 286, the fill operation does not occur because the gas in interior 156 is not able to flow into interior 120. Conversely, if second valve 240 is opened, then a fill operation begins.

During the exemplary fill operation of FIG. 9, the relative humidity of the fill gas is measured. As shown in box 288, the measured relative humidity of the fill gas is compared to a threshold relative humidity value. If the measured relative humidity of the fill gas is greater than the threshold relative humidity value, then second valve 240 is closed, as shown at box 290, and the fill operation ends. However, if the measured relative humidity of the fill gas is less than the threshold relative humidity value, then the fill operation continues (see box 292). The fill operation continues until monitoring system 150 receives a signal from density sensor 153 indicating that the density of the gas within enclosure 102 corresponds to a predetermined amount. As shown at box 294, the fill operation ends when the density of the gas within enclosure 102 equals the predetermined threshold amount.

Additionally, during a fill operation, the moisture of the fill gas from the vendor supplying the gas is measured. As shown at box 296, if the amount of moisture of the fill gas is greater than a predetermined threshold amount, then a consideration, such as a payment, to the vendor supplying the fill gas may be adjusted (see box 298). For example, the vendor supplying the gas may be docked a portion of the invoice amount or charged a fee for contributing to the premature need to replace drying members 122 of enclosure 102. Additionally, monitoring system 150 may also choose to end the fill operation if the amount of moisture in the fill gas from the vendor is greater than the predetermined threshold amount.

The measured relative humidity and temperature data obtained from moisture sensor 152 may be combined with the density data obtained from density sensor 153 in order to determine or forecast when the desiccant bags within enclosure 102 will become saturated, thereby increasing the relative humidity within interior 120 of enclosure 102. This forecast may also be used to determine other information, such as if water is freezing or condensing within enclosure 102. For example, using the relative humidity, temperature, and density data, the Magnus equation, shown as equation (1) below, provides the saturation vapor pressure with respect to water as a function of temperature. Based on calculations from the Magnus equation, reproduced as equation (1) below, and variations thereof, monitoring system 150 is configured to forecast when conditions within enclosure 102 may damage circuit breaker system 100 (e.g., increasing relative humidity, water within enclosure 102). Under such conditions, monitoring system 150 may initiate an alarm and/or prevent circuit breaker system 100 from operating in order to prevent damage thereto.

$$e_w = 611.2 \cdot \exp\left(\frac{17.62 \cdot t}{243.12 + t}\right) \quad \text{Equation (1)}$$

where $e_w$ is the saturation vapor pressure with respect to water in Pa t is the temperature in ° C.

In one embodiment, electronic controller 190 uses a variation of the Magnus equation (equation (1)) to calculate dew point temperature at a known vapor pressure, as shown in Equation (2) below. For example, electronic controller 190 may use the vapor pressure calculated by equation (1) or measured by a sensor to determine a dew point temperature for enclosure 102. The dew point temperature may be reported by electronic controller 190 as an output, may be used by electronic controller 190 to determine when an alarm condition exists, and/or may be used for further calculations pertaining to the conditions of enclosure 102. Equation (2) is valid over a temperature range of approximately −45° C.-50° C.

$$t_d = 243.12 \frac{\ln\left(\frac{e}{611.2}\right)}{17.62 - \ln\left(\frac{e}{611.2}\right)} \quad \text{Equation (2)}$$

where e is the vapor pressure in Pa $t_d$ is the dew point temperature in ° C.

In another embodiment, electronic controller 190 uses a variation of the Magnus equation (equation (1)) to calculate frost point temperature for enclosure 102 at a known vapor pressure, as shown in Equation (3) below. For example, electronic controller 190 may use the vapor pressure calculated by equation (1) or measured by a sensor to determine a frost point temperature for enclosure 102. The frost point temperature may be reported by electronic controller 190 as an output, may be used by electronic controller 190 to determine when an alarm condition exists, and/or may be used for further calculations pertaining to the conditions of enclosure 102. Equation (3) is valid over a temperature range of approximately −65° C.-0° C.

$$t_f = 272.62 \frac{\ln\left(\frac{e}{611.2}\right)}{22.46 - \ln\left(\frac{e}{611.2}\right)} \qquad \text{Equation (3)}$$

where e is the vapor pressure in Pa
$t_f$ is the frost point temperature in ° C.

Frost and dew points are pressure dependent and are usually measured at standard pressure (100 kPa) or at a system pressure (e.g., 450 kPa). Therefore, in one embodiment, electronic controller 190 may convert a frost point temperature or a dew point temperature at a first pressure to that at a second pressure, using Equations (4)-(6) below. For example, electronic controller 190 may use equations (1), (2), or (3) above or a measurement from a sensor in order to calculate a second frost or dew point temperature using a first vapor pressure determined at a first temperature and a second vapor pressure. The second frost or dew point temperatures may be reported by electronic controller 190 as an output, may be used by electronic controller 190 to determine when an alarm condition exists, and/or may be used for further calculations pertaining to the conditions of enclosure 102.

$$e_1 = 611.2 \cdot \exp\left(\frac{22.46 \cdot t_1}{272.62 + t_1}\right) \qquad \text{Equation (4)}$$

$$e_2 = \frac{p_2}{p_1} \cdot e_1 \qquad \text{Equation (5)}$$

$$t_2 = 272.62 \frac{\ln\left(\frac{e_2}{611.2}\right)}{22.46 - \ln\left(\frac{e_2}{611.2}\right)} \qquad \text{Equation (6)}$$

While in the illustrative embodiment, relative humidity is determined by moisture sensor 152, relative humidity also may be determined using vapor pressure data determined by equations (1)-(6), sensors, or other calculations. For example, in an alternative embodiment, electronic controller 190 may use vapor pressure and temperature data with Equations (7), ($8_1$), or ($8_2$) below in order to calculate relative humidity. The relative humidity may be reported by electronic controller 190 as an output, may be used by electronic controller 190 to determine when an alarm condition exists, and/or may be used for further calculations pertaining to the conditions of enclosure 102.

$$RH = \frac{e}{e_w} \cdot 100 \qquad \text{Equation (7)}$$

where e is the vapor pressure in Pa
$e_w$ is the saturation vapor pressure with respect to water at the given temperature t $$RH = \frac{e}{e_w} \cdot 100 \quad \text{for } t \geq 0 \qquad \text{Equation } (8_1)$$

$$RH = \frac{e}{e_i} \cdot 100 \quad \text{for } t < 0 \qquad \text{Equation } (8_2)$$

where e is the vapor pressure in Pa
$e_w$ is the saturation vapor pressure with respect to water at temperature t above 0° C.
$e_i$ is the saturation vapor pressure with respect to ice for a given temperature t below 0° C.

Additionally, in one embodiment, electronic controller 190 may use vapor pressure values determined by any of Equations (1)-($8_2$) above, in order to determine the volume ratio in parts per million by volume ($ppm_v$) or the weight ratio in parts per million by weight ($ppm_w$), as shown below in Equations (9) and (10), respectively. For example, electronic controller 190 may use vapor pressure values to report the parts per million by volume value. The parts per million by volume value may be reported by electronic controller 190 as an output, may be used by electronic controller 190 to determine when an alarm condition exists, and/or may be used for further calculations pertaining to the conditions of enclosure 102.

$$ppm_v = \frac{e}{p - e} \cdot 10^6 \qquad \text{Equation (9)}$$

where e is the vapor pressure in Pa
p is the total pressure at which the vapor pressure e is measured $$ppm_w = \frac{M_v}{M_g} \cdot \frac{e}{p - e} \cdot 10^6 \qquad \text{Equation (10)}$$

where e is the vapor pressure in Pa
p is the total pressure at which the vapor pressure e is measured
$M_v$ is the molecular weight of water ($H_2O$), 18.02 g/mol
$M_g$ is the molecular weight of the carrier gas For example, if Sulfur Hexafluoride ($SF_6$) is the carrier gas, then electronic controller 190 calculates parts per million by weight using the molecular weight ($M_g$) of $SF_6$, which is known to be 146.05 g/mol, in order to determine the ratio of the mass of water to the mass of $SF_6$. In one embodiment, the parts per million by weight value may be reported by electronic controller 190 as an output, may be used by electronic controller 190 to determine when an alarm condition exists, and/or may be used for further calculations pertaining to the conditions of enclosure 102.

In another embodiment, electronic controller 190 may calculate volume fractions, measured in parts per million by volume ($ppm_v$), in order to provide the ratio of the number of water molecules to the total number of molecules, as shown in Equation (11) below. For example, electronic controller may use a vapor pressure and a total pressure value determined by any of equations (1)-(10) above or a sensor in order to report the volume fraction of the number of water molecules to the total number of molecules. The parts per million by volume may be reported by electronic controller 190 as an output, may be used by electronic controller 190 to determine when an alarm condition exists, and/or may be used for further calculations pertaining to the conditions of enclosure 102.

$$ppm_v = \frac{e}{p} \cdot 10^6 \qquad \text{Equation (11)}$$

where e is the vapor pressure in Pa p is the total pressure at which the vapor pressure e is measured In a further embodiment, electronic controller 190 may calculate a weight fraction, measured in parts per million by weight ($ppm_w$), in order to determine the ratio of the mass of water to the mass of the total gas, as shown in Equation (12) below. For example, electronic controller may use a vapor pressure and a total pressure value determined by any of equations (1)-(10) above or a sensor, as well as the molecular weight of water and the carrier gas within enclosure 102, in order to report the weight fraction of the mass of water to the mass of the total gas within enclosure 102. The parts per million by weight may be reported by electronic controller 190 as an output, may be used by electronic controller 190 to determine when an alarm condition exists, and/or may be used for further calculations pertaining to the conditions of enclosure 102.

$$ppm_w = \frac{M_v}{M_g} \cdot \frac{e}{p} \cdot 10^6 \qquad \text{Equation (12)}$$

where e is the vapor pressure in Pa p is the total pressure at which the vapor pressure e is measured $M_v$ is the molecular weight of water ($H_2O$), 18.02

$M_g$ is the molecular weight of the carrier gas

For example, if the carrier gas is $SF_6$, then electronic controller 190 calculates parts per million by weight using the molecular weight ($M_g$) of $SF_6$, which is 146.05 g/mol, in order to determine the weight fraction of the mass of water to the mass of the total gas within enclosure 102. In one embodiment, the parts per million by weight value may be reported by electronic controller 190 as an output, may be used by electronic controller 190 to determine when an alarm condition exists, and/or may be used for further calculations pertaining to the conditions of enclosure 102.

In one embodiment, electronic controller 190 may use the value for parts per million by volume ($ppm_v$) to calculate vapor pressure and frost point, relative to a total pressure of the system using Equations (13) and (14), respectively. In another embodiment, electronic controller 190 may use frost point to calculate vapor pressure and parts per million by volume ($ppm_v$) relative to a measured pressure of the system using Equations (15) and (16), respectively. For example, the vapor pressure values, frost point values, and/or parts per million by volume may be reported by electronic controller 190 as an output, may be used by electronic controller 190 to determine when an alarm condition exists, and/or may be used for further calculations pertaining to the conditions of enclosure 102.

$$e_i = \frac{ppm_v \cdot p}{ppm_v + 10^6} \qquad \text{Equation (13)}$$

$$t_f = 272.62 \frac{\ln\left(\frac{e_i}{611.2}\right)}{22.46 - \ln\left(\frac{e_i}{611.2}\right)} \qquad \text{Equation (14)}$$

$$e = 611.2 \cdot \exp\left(\frac{22.46 \cdot t_f}{272.62 + t_f}\right) \qquad \text{Equation (15)}$$

$$ppm_v = \frac{e}{p - e} \cdot 10^6 \qquad \text{Equation (16)}$$

While this invention has been described as having an exemplary design, the present invention may be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains.

The invention claimed is:

1. A method of monitoring a circuit breaker having a first conductive element and a second conductive element moveable relative to the first conductive element, the first conductive element and the second conductive element cooperating to provide a closed state that permits an electrical current to flow between the first conductive element and the second conductive element and an open state wherein the first conductive element is spaced apart from the second conductive element, the first conductive element and the second conductive element being positioned in an interior of an enclosure including an arc quenching gas, the method comprising the steps of:
    positioning at least one fluid characteristic sensor in fluid communication with the interior of the enclosure;
    monitoring a relative humidity of the interior of the enclosure with the at least one fluid characteristic sensor; and
    forecasting a maintenance event of the circuit breaker based on the relative humidity.

2. The method of claim 1, further comprising the step of comparing the relative humidity of the interior of the enclosure to a predetermined threshold value.

3. The method of claim 2, further comprising the step of controlling the state of the first and second conductive elements when the relative humidity of the interior of the enclosure is greater than the predetermined threshold value.

4. A method of monitoring conditions within an interior of an enclosure of a circuit breaker, the enclosure including a first conductive element and a second conductive element moveable relative to the first conductive element, the method comprising the steps of:
    introducing a fluid containing an arc-quenching gas into the interior of the enclosure;
    monitoring relative humidity of the fluid within the interior of the enclosure;
    comparing the relative humidity of the fluid to a predetermined threshold value; and
    maintaining a flow of the fluid into the interior of the enclosure when the relative humidity of the fluid is less than the predetermined threshold value.

5. The method of claim 4, wherein at least one fluid characteristic sensor is configured to cooperate with an electronic controller to measure the relative humidity of the fluid during the monitoring step.

6. The method of claim 5, wherein the at least one fluid characteristic sensor is a moisture sensor.

7. The method of claim 5, wherein the at least one fluid characteristic sensor includes a temperature sensor and density sensor.

8. The method of claim 7, further comprising the step of calculating the relative humidity of the fluid from data of the temperature sensor and data from the density sensor.

9. The method of claim 4, further comprising the step of monitoring a density of the fluid within the interior of the enclosure.

10. The method of claim 9, further comprising the step of discontinuing the flow of the fluid into the interior of the enclosure when the density of the fluid is greater than a predetermined threshold value.

11. The method of claim 4, further comprising the step of monitoring an amount of moisture in the fluid being introduced into the interior of the enclosure.

12. The method of claim 11, further comprising the steps of receiving the fluid from a gas supply vendor and adjusting a consideration to the gas supply vendor when the amount of moisture in the fluid is greater than a predetermined threshold amount.

13. The method of claim 12, wherein the consideration is a payment.

* * * * *